United States Patent
Poilasne et al.

(10) Patent No.: US 7,184,727 B2
(45) Date of Patent: Feb. 27, 2007

(54) FULL-DUPLEX ANTENNA SYSTEM AND METHOD

(75) Inventors: Gregory Poilasne, San Diego, CA (US); Jorge Fabrega-Sanchez, San Diego, CA (US); Stanley S. Toncich, San Diego, CA (US); Allen Tran, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 443 days.

(21) Appl. No.: 10/899,285

(22) Filed: Jul. 26, 2004

(65) Prior Publication Data

US 2005/0085204 A1    Apr. 21, 2005

Related U.S. Application Data

(63) Continuation-in-part of application No. 10/117,628, filed on Apr. 4, 2002, now Pat. No. 6,861,985, and a continuation-in-part of application No. 10/120,603, filed on Apr. 9, 2002, now Pat. No. 6,885,341, and a continuation-in-part of application No. 10/075,896, filed on Feb. 12, 2002, now Pat. No. 6,765,540.

(51) Int. Cl.
  H04B 1/18    (2006.01)
  H04B 1/46    (2006.01)
  H04M 1/00    (2006.01)

(52) U.S. Cl. ................. 455/179.1; 455/188.1; 455/269; 455/82; 455/575.7; 343/700; 343/860

(58) Field of Classification Search ............ 455/179–1, 455/188.1, 269, 82, 562.1, 575.7; 343/700, 343/702, 745, 909, 860

See application file for complete search history.

(56) References Cited

U.S. PATENT DOCUMENTS 3,239,838 A    3/1966   Kelleher
3,413,543 A    11/1968  Schubring et al.

(Continued)

FOREIGN PATENT DOCUMENTS

DE          40 36 866 A1    7/1991

(Continued)

OTHER PUBLICATIONS

Presser, A., "Varactor-Tunable, High-Q Microwave Filter," RCA Review, vol. 42, Dec. 1981, pp. 691-705.

(Continued)

*Primary Examiner*—Tony T. Nguyen

(57) ABSTRACT

A system and method is provided for full-duplex antenna impedance matching. The method comprises: effectively resonating a first antenna at a frequency selectable first channel in a first frequency band; generating a first antenna impedance at the first channel frequency; effectively resonating a second antenna at a frequency selectable second channel in the first frequency band; generating a second antenna impedance at the second channel frequency; supplying a first conjugate impedance match at the first channel frequency; and, supplying a second conjugate impedance match at the second channel frequency. For example, the first antenna may be used for transmission, while the second antenna is used for received communications. The antennas effectively resonant in response to: supplying frequency selectable conjugate impedance matches to the antennas; generating frequency selectable antenna impedances; and/or selecting the frequency of antenna resonance.

59 Claims, 9 Drawing Sheets

U.S. PATENT DOCUMENTS

| | | |
|---|---|---|
| 3,569,795 A | 3/1971 | Gikow |
| 3,676,803 A | 7/1972 | Simmons |
| 3,678,305 A | 7/1972 | Paige |
| 3,680,135 A | 7/1972 | Boyer |
| 3,737,814 A | 6/1973 | Pond |
| 3,739,299 A | 6/1973 | Adler |
| 3,836,874 A | 9/1974 | Maeda et al. |
| 3,918,012 A | 11/1975 | Peuzin |
| 4,122,400 A | 10/1978 | Medendorp et al. |
| 4,236,125 A | 11/1980 | Bernard et al. |
| 4,475,108 A | 10/1984 | Moser |
| 4,484,157 A | 11/1984 | Helle et al. |
| 4,494,081 A | 1/1985 | Lea et al. |
| 4,525,720 A | 6/1985 | Corzine et al. |
| 4,626,800 A | 12/1986 | Murakami et al. |
| 4,733,328 A | 3/1988 | Blazej |
| 4,736,169 A | 4/1988 | Weaver et al. |
| 4,737,797 A | 4/1988 | Siwiak et al. |
| 4,746,925 A | 5/1988 | Toriyama |
| 4,792,939 A | 12/1988 | Hikita et al. |
| 4,799,066 A | 1/1989 | Deacon |
| 4,835,499 A | 5/1989 | Pickett |
| 4,835,540 A | 5/1989 | Haruyama et al. |
| 4,847,626 A | 7/1989 | Kahler et al. |
| 4,975,604 A | 12/1990 | Barta |
| 5,166,857 A | 11/1992 | Avanic et al. |
| 5,173,709 A | 12/1992 | Lauro et al. |
| 5,212,463 A | 5/1993 | Babbitt et al. |
| 5,216,392 A | 6/1993 | Fraser |
| 5,227,748 A | 7/1993 | Sroka |
| 5,231,407 A | 7/1993 | McGirr et al. |
| 5,293,408 A | 3/1994 | Takahashi et al. |
| 5,307,033 A | 4/1994 | Koscica et al. |
| 5,325,099 A | 6/1994 | Nemit et al. |
| 5,388,021 A | 2/1995 | Stahl |
| 5,406,163 A | 4/1995 | Carson et al. |
| 5,416,803 A | 5/1995 | Janer |
| 5,427,988 A | 6/1995 | Sengupta et al. |
| 5,450,092 A | 9/1995 | Das |
| 5,451,915 A | 9/1995 | Katzin et al. |
| 5,459,123 A | 10/1995 | Das |
| 5,472,935 A | 12/1995 | Yandrofski et al. |
| 5,479,139 A | 12/1995 | Koscica et al. |
| 5,495,215 A | 2/1996 | Newell et al. |
| 5,496,795 A | 3/1996 | Das |
| 5,496,796 A | 3/1996 | Das |
| 5,502,422 A | 3/1996 | Newell et al. |
| 5,525,942 A | 6/1996 | Horii et al. |
| 5,557,286 A | 9/1996 | Varadan et al. |
| 5,561,307 A | 10/1996 | Mihara et al. |
| 5,561,407 A | 10/1996 | Koscica et al. |
| 5,564,086 A | 10/1996 | Cygan et al. |
| 5,574,410 A | 11/1996 | Collins et al. |
| 5,577,025 A | 11/1996 | Skinner |
| 5,583,524 A | 12/1996 | Milroy |
| 5,589,845 A | 12/1996 | Yandrofski |
| 5,600,279 A | 2/1997 | Mori |
| 5,617,104 A | 4/1997 | Das |
| 5,640,042 A | 6/1997 | Koscica et al. |
| 5,649,306 A | 7/1997 | Vannatta et al. |
| 5,652,599 A | 7/1997 | Wallace et al. |
| 5,673,188 A | 9/1997 | Lusher et al. |
| 5,701,595 A | 12/1997 | Green, Jr. |
| 5,721,194 A | 2/1998 | Yandrofski et al. |
| 5,729,239 A | 3/1998 | Rao |
| 5,777,524 A | 7/1998 | Wojewoda et al. |
| 5,777,839 A | 7/1998 | Sameshina et al. |
| 5,778,308 A | 7/1998 | Sroka et al. |
| 5,830,591 A | 11/1998 | Sengupta et al. |
| 5,834,975 A | 11/1998 | Bartlett et al. |
| 5,864,932 A | 2/1999 | Evans et al. |
| 5,870,670 A | 2/1999 | Ripley |
| 5,880,921 A | 3/1999 | Tham et al. |
| 5,892,486 A | 4/1999 | Cook et al. |
| 5,908,811 A | 6/1999 | Das |
| 5,945,887 A | 8/1999 | Makino et al. |
| 5,965,494 A | 10/1999 | Terashima et al. |
| 5,973,567 A | 10/1999 | Heal et al. |
| 5,973,568 A | 10/1999 | Shapiro et al. |
| 5,986,515 A | 11/1999 | Sakurai |
| 5,987,314 A | 11/1999 | Salto |
| 5,990,766 A | 11/1999 | Zhan |
| 6,008,659 A | 12/1999 | Traynor |
| 6,018,282 A | 1/2000 | Tsuda |
| 6,020,787 A | 2/2000 | Kim et al. |
| 6,026,311 A | 2/2000 | Willemsen Cortes et al. |
| 6,028,561 A | 2/2000 | Takei |
| 6,049,726 A | 4/2000 | Gruenwald et al. |
| 6,052,036 A | 4/2000 | Enstrom et al. |
| 6,054,908 A | 4/2000 | Jackson |
| 6,094,588 A | 7/2000 | Adam |
| 6,097,263 A | 8/2000 | Mueller et al. |
| 6,101,102 A | 8/2000 | Brand et al. |
| 6,108,191 A | 8/2000 | Bruchhaus et al. |
| 6,121,940 A * | 9/2000 | Skahill et al. ............... 343/860 |
| 6,160,524 A | 12/2000 | Wilber |
| 6,181,777 B1 | 1/2001 | Kiko |
| 6,198,441 B1 | 3/2001 | Okabe |
| 6,216,020 B1 | 4/2001 | Findikoglu |
| 6,242,843 B1 | 6/2001 | Pohjonen et al. |
| 6,272,336 B1 | 8/2001 | Appel et al. |
| 6,278,383 B1 | 8/2001 | Endo et al. |
| 6,281,023 B2 | 8/2001 | Eastep et al. |
| 6,281,534 B1 | 8/2001 | Arita et al. |
| 6,285,337 B1 | 9/2001 | West et al. |
| 6,292,143 B1 | 9/2001 | Romanofsky |
| 6,294,964 B1 | 9/2001 | Satoh |
| 6,308,051 B1 | 10/2001 | Atokawa |
| 6,327,463 B1 | 12/2001 | Welland |
| 6,329,959 B1 | 12/2001 | Varadan et al. |
| 6,333,719 B1 | 12/2001 | Varadan |
| 6,335,710 B1 | 1/2002 | Falk et al. |
| 6,344,823 B1 | 2/2002 | Deng |
| 6,359,444 B1 | 3/2002 | Grimes |
| 6,362,784 B1 | 3/2002 | Kane et al. |
| 6,362,789 B1 | 3/2002 | Trumbull et al. |
| 6,384,785 B1 | 5/2002 | Kamogawa et al. |
| 6,404,304 B1 | 6/2002 | Kwon et al. |
| 6,456,236 B1 | 9/2002 | Hauck et al. |
| 6,462,628 B2 | 10/2002 | Kondo et al. |
| 6,489,860 B1 | 12/2002 | Ohashi |
| 6,503,786 B2 | 1/2003 | Klodzinski |
| 6,518,850 B1 | 2/2003 | Falk et al. |
| 6,518,920 B2 | 2/2003 | Proctor, Jr. et al. |
| 6,522,220 B2 | 2/2003 | Yamada et al. |
| 6,525,630 B1 | 2/2003 | Zhu et al. |
| 6,525,691 B2 | 2/2003 | Varadan et al. |
| 6,531,936 B1 | 3/2003 | Chiu et al. |
| 6,559,737 B1 | 5/2003 | Nagra et al. |
| 6,571,110 B1 | 5/2003 | Patton et al. |
| 6,600,456 B2 | 7/2003 | Gothard et al. |
| 6,621,467 B1 * | 9/2003 | Marsh ........................ 343/850 |
| 6,653,977 B1 | 11/2003 | Okabe et al. |
| 6,667,723 B2 | 12/2003 | Forrester |
| 6,671,494 B1 * | 12/2003 | James ........................ 455/66.1 |
| 6,686,817 B2 | 2/2004 | Zhu et al. |
| 6,721,293 B1 | 4/2004 | Komulainen et al. |
| 6,727,535 B1 | 4/2004 | Sengupta et al. |
| 2001/0026243 A1 | 10/2001 | Koitsalu et al. |
| 2001/0043159 A1 | 11/2001 | Masuda et al. |
| 2002/0049064 A1 | 4/2002 | Banno |
| 2002/0149526 A1 | 10/2002 | Tran et al. |
| 2002/0149535 A1 | 10/2002 | Toncich |
| 2002/0175878 A1 | 11/2002 | Toncich |

| | | | |
|---|---|---|---|
| 2003/0062971 | A1 | 4/2003 | Toncich |
| 2003/0134665 | A1 | 7/2003 | Kato et al. |
| 2004/0196121 | A1 | 10/2004 | Toncich |
| 2004/0263411 | A1 | 12/2004 | Fabrega-Sanchez et al. |
| 2005/0007291 | A1 | 1/2005 | Fabrega-Sanchez et al. |

FOREIGN PATENT DOCUMENTS

| | | |
|---|---|---|
| DE | 100 24 483 | 11/2001 |
| DE | 101 37 753 | 2/2003 |
| EP | 0 125 586 | 11/1984 |
| EP | 0 346 089 | 12/1989 |
| EP | 0 473 373 | 3/1992 |
| EP | 0 531 125 | 3/1993 |
| EP | 0 631 399 | 12/1994 |
| EP | 0 637 131 A1 | 2/1995 |
| EP | 0 638 953 A1 | 2/1995 |
| EP | 0 680 108 A1 | 11/1995 |
| EP | 0 795 922 A1 | 9/1997 |
| EP | 0 843 374 A2 | 5/1998 |
| EP | 0 854 567 | 7/1998 |
| EP | 0 872 953 | 10/1998 |
| EP | 0 881 700 A1 | 12/1998 |
| EP | 0 892 459 | 1/1999 |
| EP | 0 909 024 A2 | 4/1999 |
| EP | 1 043 741 A2 | 10/2000 |
| EP | 1 058 333 | 12/2000 |
| EP | 1 248 317 | 10/2002 |
| GB | 2 240 227 | 7/1991 |
| JP | 63 128618 | 6/1988 |
| JP | 05182857 | 7/1993 |
| JP | 290500-2001133839 | 7/2001 |
| WO | WO 82/03510 | 10/1982 |
| WO | WO 94/13028 | 6/1994 |
| WO | WO 94/27376 | 11/1994 |
| WO | WO 00/28613 | 5/2000 |
| WO | WO 00/35042 | 6/2000 |
| WO | WO 00/62367 | 10/2000 |
| WO | WO 00/79645 A1 | 12/2000 |
| WO | WO 00/79648 A1 | 12/2000 |
| WO | WO 03/058759 | 7/2001 |
| WO | WO 02/084798 | 10/2002 |

OTHER PUBLICATIONS

Chang, C. et al., "Microwave Active Filters Based on Coupled Negative Resistance Method," IEEE Trans. on Microwave Theory & Tech., vol. 38, No. 12, Dec. 1990, pp. 1879-1884.

Katzin, P. et al., "Narrow-band MMIC Filters with Automatic Tuning and Q-Factor Control," 1993 IEEE MTT-S Int. Microwave Symposium Digest, pp. 403-406.

Hopf, B. et al., "Coplanar MMIC Active Bandpass Filters Using Negative Resistance Circuits," 1994 IEEE MTT-S Symposium Digest, pp. 1183-1185.

Karacaoglu, U. et al., "High Selectivity Varactor-Tuned MMIC Bandpass Filter Using Lossless Active Resonators," 1994 IEEE MTT-Symposium Digest, pp. 1191-1194.

Nauta, B., "A CMOS Transconductance-C Filter Technique for Very High Frequencies," IEEE Journal of Solid-State Circuits, vol. 27, No. 2, Feb. 1992, pp. 142-153.

Fujita, K. et al., "A 15.6 GHz Commercially Based 1/8 GaAs Dynnamic Presealer," 1989 IEEE GaAs IC Symposium, pp. 113-116.

Smuk, J. et al., "MMIC Phase Locked L-S Band Oscillators," 1994 IEEE GaAs Symposium Digest, pp. 27-29.

Chandler, S.R. et al., "Active Varactor Tunable Bandpass Filter," IEEE Microwave and Guided Wave Letters, vol. 3, Mar. 1993, pp. 70-71.

Hunter, I.C. et al., "Electronically Tunable Microwave Bandpass Filters," IEEE Trans. on MTT, vol. 30, No. 9, Sep. 1982, pp. 1354-1367.

Toyoda, S., "Quarter-wavelength Coupled Variable Bandstop and Bandpass Filters Using Varactor Diodes," IEEE Trans. on MTT, vol. 30, No. 9, Sep. 1982, pp. 1387-1389.

Yu, B., "Variety of Approaches to Designing Microwave Active Filters," Proc. 27th European Microwave Conference, Jerusalem, vol. 1, 1997, pp. 397-408.

Yu, B., "Understand the Operation of Channelized Active Filters," Microwaves & RF, Jan. 1997, pp. 89-92.

Dishal, M., "Alignment and Adjustment of Synchronously Tuned Multiple Resonator-Circuit Filters," Proc. IRE 39, Nov. 1951, pp. 1448-1455.

Cohn, S.B., "Dissipation Loss in Multiple-Coupled Resonator Filters," Proc. IRE 47, Aug. 1959, pp. 1342-1348.

Matthael, G.L., "An Electronically Tunable Up-Converter," Proc. IRE 49, Nov. 1961, pp. 1703-1704.

Fubini, E.G. et al., "Minimum Insertion Loss Filters," Proc. IRE 47, Jan. 1959, pp. 37-41.

Getsinger, W.J., "Prototypes for Use in Broadbanding Reflection Amplifiers," IEEE Trans. PTGMTT-11, Nov. 1963, pp. 486-497.

Kuh, E.S. et al., "Optimum Sunthesis of Wide-Band Parametric Amplifiers and Converters," IRE Trans. PCCT-8, Dec. 1961, pp. 410-415.

Getsinger, W.J. et al., "Some Aspects of the Design of Wide-Band Up-Converters and Nondegenerate Parametric Amplifiers," IEEE Trans. PTGMTT-12, Jan. 1964, pp. 77-87.

Sleven, R.L., "Design of a Tunable Multi-Cavity Waveguide Band-Pass Filter," 1959 IRE National Convention Record, Part 3, pp. 91-112.

Taub, J.J. et al., "Design of Three-Resonator Dissipative Band-Pass Filters Having Minimum Insertion Loss," Proc. IRE 45, pp. 681-687 (May 1957).

Kotzebue, K.L., "Broadband Electronically-Tunable Microwave Filters," 1960 IRE Wescon Convention Record, Part 1, pp. 21-27.

Louhos, J.P. et al., "Electrical Tuning of Integrated Mobile Phone Antennas," Nokia Mobile Phones, pp. 69-97 (Sep. 15, 1999).

Panayi, P.K. et al., "Tuning Techniques for the Planar Inverted-F Antenna," National Conference on Antennas and Propagation Publication, No. 461, pp. 259-262, (Apr. 1999).

Makioka, S. et al., "A High Efficiency GaAs MCM Power Amplifier for 1.9 GHz Digital Cordless Telephones," IEEE 1994 Microwave & Millimeter-Wave Monolithic Cir. Sym., pp. 51-54.

Varadan, V.K. et al., "Design and Development of Electronically Tunable Microstrip Antennas," IOP Publishing Ltd., pp. 238-242, (1999).

Communication Relating to the Results of the Partial International Search: PCT/IB 02/01077 (2002).

Jose et al., "Experimental Investigations on Electronically Tunable Microstrip Antennas," Microwave and Optical Technology Letters, vol. 20, No. 3, pp. 166-169 (Feb. 5, 1999).

International Search Report: PCT/IB 02/01086 (Jun. 24, 2002).
International Search Report: PCT/IB 02/01078 (Jul. 10, 2002).
International Search Report: PCT/IB 02/01087 (Jul. 11, 2002).
International Search Report: PCT/IB 02/01107 (Jul. 11, 2002).
International Search Report: PCT/IB 02/01120 (Jul. 11, 2002).
International Search Report: PCT/IB 02/01098 (Jul. 4, 2002).
International Search Report: PCT/IB 02/01082 (Jul. 8, 2002).
International Search Report: PCT/IB 02/01144 (Jul. 12, 2002).
International Search Report: PCT/IB 02/01026 (Jun. 28, 2002).
International Search Report: PCT/IB 02/01027 (Jun. 25, 2002).

Cuthbert, T., "Broadband Impedance Matching—Fast and Simple", RF Design, Cardiff Publishing Co., vol. 17, No. 12, Nov. 1994, pp. 38, 42, 44, 48, XP000477834.

Erker et al., "Monolithic Ka-Band Phase Shifter Using Voltage Tunable BaSrTiO3 Parallel Plate Capacitors", IEEE Microwave and Guided Wave Letters, IEEE Inc., vol. 10, No. 1, Jan. 2000, pp. 10-12 XP-000930368.

Galt, D. et al., "Ferroelectric Thin Film Characterization Using Superconducting Microtstrip Resonators", IEEE Trans on Appl Superconductivity Jun. 1995 IEEE, pp. 2575-2578, vol. 5, No.2, Piscataway, NJ, USA.

Gevorgian, Spartak S. et al., "HTS/Ferroelectric Devices for Microwave Applications", IEEE Transactions on Applied Superconductivity, Jun. 1997, pp. 2458-2461, IEEE, USA.

Keis, V. N. et al., "20GHz tunable filter based on ferroelectric (BaSr)TiO3 film varactors", Electronics Letters, May 28, 1998, vol. 34, No. 11, IEE Stevenage, GB.

Krautkramer, V.W. et al., "Resonanztransformatoren mit drei Reaktanzen als transformierende Filter", Bulletin des Schweizerischen Elektrotechnischen Vereins, Zurich, CH, vol. 64, No. 23, Nov. 10, 1973, pp. 1500-1509, XP002184530.

Toncich et al., "Data Reduction Method for Q Measurements of Stripline Resonators", IEEE Transactions in MTT, vol. 40, No. 9, Sep. 1992, pp. 1833-1836.

Vendik, O.G. et al., "1GHz tunable resonator on bulk single crystal SrTiO3 plated with Yba2Cu307-x films", Electronics Letters, Apr. 13, 1995, pp. 654-656, vol. 31, No. 8, IEE Stevenage, GB.

International Search Report: PCT/US2005/024991(Nov. 3, 2005).

* cited by examiner

FULL-DUPLEX ANTENNA SYSTEM AND METHOD

RELATED APPLICATIONS

This application is related to and is a continuation-in-part of U.S. applications "FERROELECTRIC ANTENNA AND METHOD FOR TUNING SAME", Ser. No. 10/117,628, filed on Apr. 4, 2002 now U.S. Pat. No. 6,861,985; "INVERTED-F FERROELECTRIC ANTENNA", Ser. No. 10/120,603, filed on Apr. 9, 2002 now U.S. Pat. No. 6,885,341; and "TUNABLE ANTENNA MATCHING CIRCUIT", Ser. No. 10/075,896, filed on Feb. 12, 2002 now U.S. Pat. No. 6,765,540, all of which are incorporated herein by reference.

This application is related to U.S. APPLICATIONS "TUNABLE HORN ANTENNA", Ser. No. 10/122,399, filed on Apr. 12, 2002; "TUNABLE WAVEGUIDE ANTENNA", Ser. No. 10/122,968, filed on Apr. 11, 2002; "TUNABLE DIPOLE ANTENNA", Ser. No. 10/121,773, filed on Apr. 11, 2002; and "TUNABLE MATCHING CIRCUIT", Ser. No. 09/927,136, filed on Aug. 10, 2001, all of which are incorporated herein by reference.

This application is also related to the following two U.S. applications filed on the same day as the present application and having the same inventors, and which applications are incorporated herein by reference: "SYSTEM AND METHOD FOR IMPEDANCE MATCHING AN ANTENNA TO SUB-BANDS IN A COMMUNICATION BAND"; and "SYSTEM AND METHOD FOR DUAL-BAND ANTENNA MATCHING".

BACKGROUND OF THE INVENTION

1. Field of the Invention

This invention generally relates to wireless communication antenna and, more particularly, to a system and method for a full-duplex antenna and corresponding antenna matching circuitry.

2. Description of the Related Art

The size of portable wireless communications devices, such as telephones, continues to shrink, even as more functionality is added. As a result, the designers must increase the performance of components or device subsystems and reduce their size, while packaging these components in inconvenient locations. One such critical component is the wireless communications antenna. This antenna may be connected to a telephone transceiver, for example, or a global positioning system (GPS) receiver.

State-of-the-art wireless telephones are expected to operate in a number of different communication bands. In the US, the cellular band (AMPS), at around 850 megahertz (MHz), and the PCS (Personal Communication System) band, at around 1900 MHz, are used. Other communication bands include the PCN (Personal Communication Network) and DCS at approximately 1800 MHz, the GSM system (Groupe Speciale Mobile) at approximately 900 MHz, and the JDC (Japanese Digital Cellular) at approximately 800 and 1500 MHz. Other bands of interest are GPS signals at approximately 1575 MHz, Bluetooth at approximately 2400 MHz, and wideband code division multiple access (WCDMA) at 1850 to 2200 MHz.

Wireless communications devices are known to use simple cylindrical coil or whip antennas as either the primary or secondary communication antennas. Inverted-F antennas are also popular. The resonance frequency of an antenna is responsive to its electrical length, which forms a portion of the operating frequency wavelength. The electrical length of a wireless device antenna is often at multiples of a quarter-wavelength, such as $5\lambda/4$, $3\lambda/4$, $\lambda/2$, or $\lambda/4$, where $\lambda$ is the wavelength of the operating frequency, and the effective wavelength is responsive to the physical length of the antenna radiator and the proximate dielectric constant.

Conventionally, each wireless device transceiver (receiver and/or transmitter) is connected to a discrete antenna that resonates in a particular communication band. The transceiver may be tuned to channels within the communication band. However, portable wireless devices are becoming available that incorporate a number of transceivers, each operating in a different communication band, or a transceiver that can be tuned to operate in a number of communications bands. A brute-force approach has been to add a different resonator or antenna for each communication band. For example, it is known to stack two microstrip patches with different areas to create non-harmonically related resonant frequency responses. Such a design is not always adequate to cover all the required frequencies (communication bands), however. One work-around solution for the above-mentioned antenna has been to widen the bandpass response of in the higher communication band, to cover GPS and PCS communications for example, and to use the lower communication band to resonate at cellular band (AMPS) frequencies. However, the widening of the higher band, to improve GPS and PCS performance, comes at the expense of cellular band performance.

Another antenna-related problem stems from the duplex nature of wireless telephone communications. Typically, the transmit sub-band frequencies of a communication band are located adjacent to the receive sub-band frequencies. As a result, the transmitter and receiver often share the use of the same antenna. In some aspects, the transmissions and received communications occur simultaneously. Since the antenna, and associated circuitry is shared, a significant amount of coupling may occur. For example, transmit signals that couple into the receiver raise the receiver noise floor and degrade sensitivity. Decoupling could be enhanced, the filtering circuitry simplified and made smaller, and the overall performance of a wireless telephone could be improved if the transmitter and receiver did not share the same antenna.

Conventional antenna designs incorporate the use of a dielectric material. Generally speaking, a portion of the field that is generated by the antenna returns to the counterpoise (ground), from the radiator, through the dielectric. The antenna is tuned to be resonant at frequencies, and the wavelength of the radiator, and dielectric constant have an optimal relationship at the resonant frequency. The most common dielectric is air, with a dielectric constant of 1. The dielectric constants of other materials are defined with respect to air.

Ferroelectric materials have a dielectric constant that changes in response to an applied voltage. Because of their variable dielectric constant, ferroelectric materials are good candidates for making tunable components. Conventional measurement techniques, however, have characterized ferroelectric components as substantially lossy, regardless of the processing, doping or other fabrication techniques used to improve their loss properties. They have therefore not been widely used. Ferroelectric tunable components operating in RF or microwave regions are perceived as being particularly lossy. This observation is supported by experience in radar applications where, for example, high radio frequency (RF) or microwave loss is the conventional rule for bulk (thickness greater than about 1.0 mm) FE (ferroelectric) materials especially when maximum tuning is desired. In general, most FE materials are lossy unless steps are taken to improve (reduce) their loss. Such steps include, but are not limited to: (1) pre and post deposition annealing or both to compensate for $O_2$ vacancies, (2) use of buffer layers to reduce surfaces stresses, (3) alloying or buffering with other materials and (4) selective doping.

As demand for limited range tuning of lower power components has increased in recent years, the interest in ferroelectric materials has turned to the use of thin film rather than bulk materials. The assumption of high ferroelectric loss, however, has carried over into thin film work as well. Conventional broadband measurement techniques have bolstered the assumption that tunable ferroelectric components, whether bulk or thin film, have substantial loss. In wireless communication matching circuits, for example, a Q of greater than 40, and preferably greater than 180 and, more preferably, greater than 350, is necessary at frequencies of about 2 GHz. These same assumptions apply to the design of antenna interface circuitry and transceivers.

Tunable ferroelectric components, especially those using thin films, can be employed in a wide variety of frequency agile circuits. Tunable components are desirable because they permit circuitry to be tuned in more than one communication band. A tunable component that covers multiple bands potentially reduces the total number of components, as discrete band fixed-frequency components and their associated switches become unnecessary. These advantages are particularly important in wireless handset design, where the need for increased functionality and lower cost and size are seemingly contradictory requirements. With CDMA handsets, for example, performance of individual components is highly stressed. FE materials may also permit integration of RF components that to-date have resisted shrinkage.

It would be advantageous if a full-duplex antenna system could be made using separate antennas for the transmit and receive functions.

It would be advantageous if the selectivity between the above-mentioned transmit and receive functions could be heightened using narrowband, selectable channels.

It would be advantageous if the above-mentioned antenna system could be made to work using an antenna with a selectable resonance, selectable impedance, a selectable impedance matching circuit, or combinations of the above-mentioned features.

SUMMARY OF THE INVENTION

The present invention provides a full-duplex antenna system that is able to effective decouple transmit and receiver circuitry using two separate mechanisms. First, the system uses separate antennas for the transmitter and receiver. Second, the response of the antennas is narrowed. This is accomplished by making the channels at which the antenna operates frequency selectable. This frequency selectability can be accomplished by adjusting the antenna resonance. Alternately, the selectability is accomplished by adjusting the antenna impedance. As another alternative, the frequency selectability is accomplished by adjusting the impedance supplied by the antenna by its matching circuit. Further, the selectability can be accomplished using combinations of the above-mentioned adjustment mechanisms.

Accordingly, a method is provided for full-duplex antenna impedance matching. The method comprises: effectively resonating a first antenna at a frequency selectable first channel in a first frequency band; generating a first antenna impedance at the first channel frequency; effectively resonating a second antenna at a frequency selectable second channel in the first frequency band; generating a second antenna impedance at the second channel frequency; supplying a first conjugate impedance match at the first channel frequency; and, supplying a second conjugate impedance match at the second channel frequency. For example, the first antenna may be used for transmission, while the second antenna is used for received communications.

In a first aspect, supplying a first conjugate impedance match at the first channel frequency includes supplying a frequency selectable first conjugate impedance. Likewise, supplying a second conjugate impedance match at the second channel frequency includes supplying a frequency selectable second conjugate impedance. In a second aspect, generating a first antenna impedance at the first channel frequency includes generating a frequency selectable first impedance, and generating a second antenna impedance at the second channel frequency includes generating a frequency selectable second impedance.

In a third aspect, effectively resonating a first antenna at a frequency selectable first channel in a first frequency band includes selecting the frequency of resonance. Likewise, effectively resonating a second antenna at a frequency selectable second channel in a first frequency band includes selecting the frequency of resonance.

Further, the method may provide for full-duplex operation in two completely different communication bands. That is, the method may comprise effectively resonating the first antenna at a frequency selectable third channel in a second frequency band and generating a third antenna impedance at the third channel frequency. Effectively resonating the second antenna at a frequency selectable fourth channel in the second frequency band and generating a fourth antenna impedance at the fourth channel frequency. Then, third conjugate impedance match is supplied at the third channel frequency, and a fourth conjugate impedance match is supplied at the fourth channel frequency.

Additional details of the above-described method, a full-duplex antenna system, and a wireless telephone full-duplex system, are provided below.

DETAILED DESCRIPTION OF THE PREFERRED EMBODIMENTS

Figure 1:
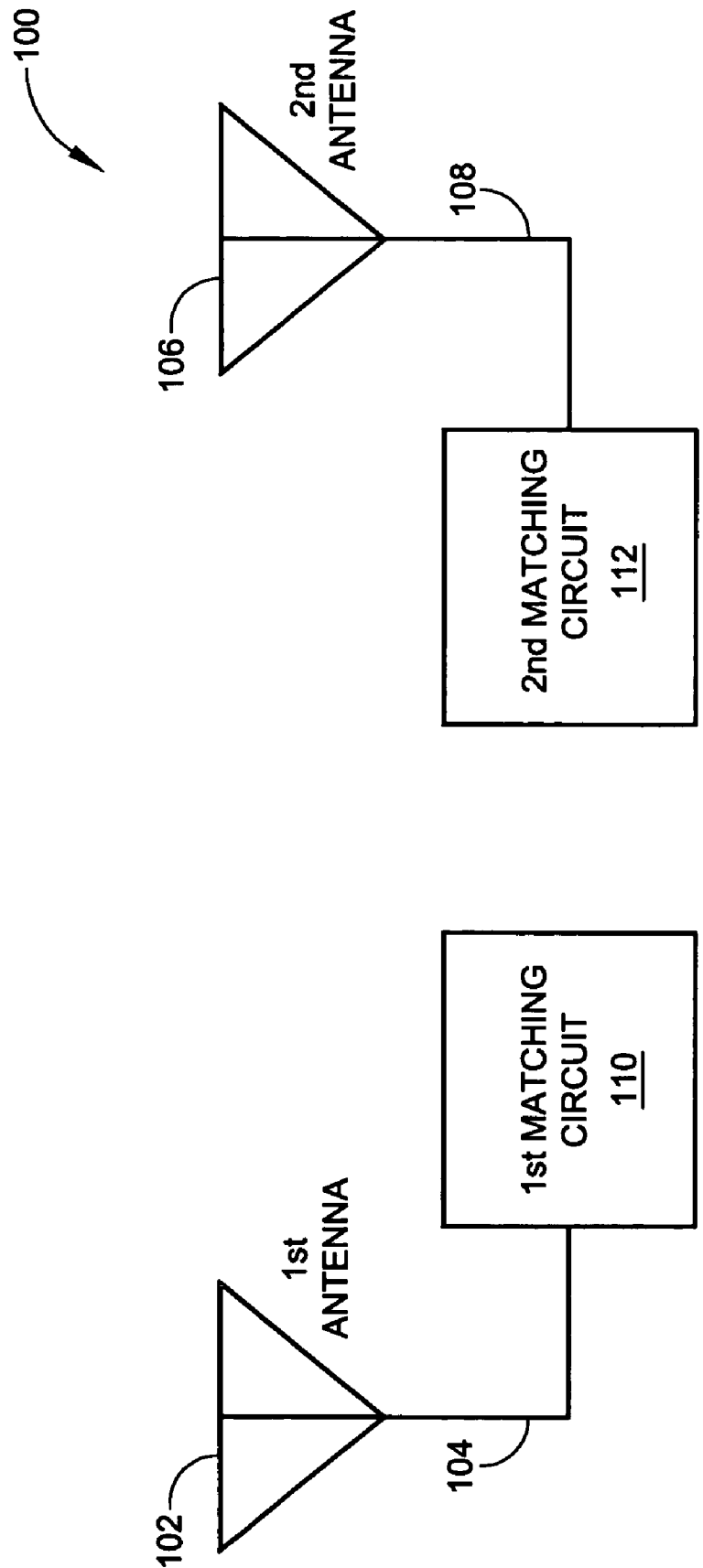
FIG. 1 is a schematic block diagram of the present invention full-duplex antenna system for selectively tuning communication channels.

FIG. 1 is a schematic block diagram of the present invention full-duplex antenna system for selectively tuning communication channels. The system 100 comprises a first antenna 102 that is effectively resonant at a frequency selectable first channel in a first frequency band. Depending upon the communication system, the first channel has a minimum frequency span that varies from several kilohertz, to megahertz (MHz). Depending on the selectivity, the frequency span may be wide enough to cover several adjacent channels. The first antenna 102 has an interface port on line 104 with a first impedance at the first channel frequency.

A second antenna 106 is effectively resonant at a frequency selectable second channel in the first frequency band. The second antenna 106 has an interface on line 108 with a second impedance at the second channel frequency. A first matching circuit 110 includes a port connected on line 104 to the first antenna interface port having a first conjugate impedance at the first channel frequency. As is understood in the art, a conjugate impedance provides an approximately equal real value and opposite imaginary value to the impedance it is matching. Further, in many cases a true conjugate match cannot be provided for an entire frequency span of interest. Then, a conjugate match is often defined for the center frequency of the span. A second matching circuit 112 includes a port connected to the second antenna interface port on line 108 having a second conjugate impedance at the second channel frequency.

The frequency selectability of the first and second channels is associated with a number of related factors. These factors are: the antenna resonance frequency, or effective electrical length of the antenna, the antenna impedance, and the matching circuit impedance. For example, in a first situation the antenna 102 may be resonant at the first channel, but poorly matched. In this situation a significant amount of power is wasted as reflected power in the interface between the antenna 102 and antenna matching circuit 110. The first situation does not describe an antenna that is "effectively resonant at the first channel", as used herein. Likewise, in a second situation the first antenna 102 and first matching circuit 110 may be properly matched at the first channel frequency. However, the antenna may not radiate efficiently at the first channel frequency. That is, the effective electrical length of the antenna may not be a quarter-wavelength multiple of the first channel frequency. Again, this situation does not describe an antenna that is effectively resonant at the first channel, or first channel frequency.

In one aspect, the first antenna 102 effectively resonates with an antenna efficiency of greater than 30%, respective to each channel in the first frequency band. Likewise, the second antenna effectively resonates with an antenna efficiency of greater than 30%, respective to each channel in the first frequency band.

Figure 2:
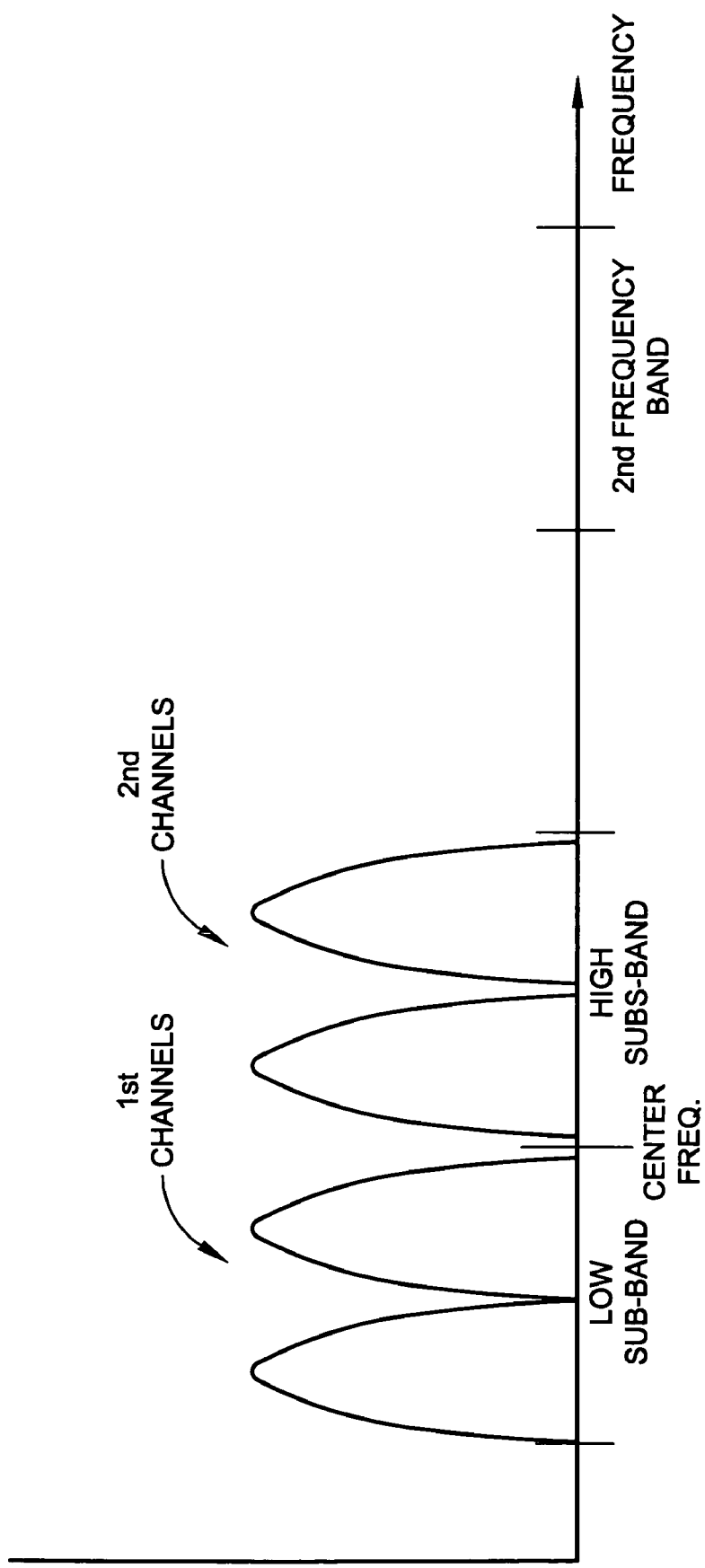
FIG. 2 is a frequency plot depicting the relationship between the first and second channels.

FIG. 2 is a frequency plot depicting the relationship between the first and second channels. For example, the first antenna (first channel) may receive radiated communications, while the second antenna (second channel) transmits radiated communications. As shown, the first channel can be selected with a low sub-band, while the second channel is selected from a high sub-band of the first frequency band. Although, only 2 first channel selections are shown in the figure, the invention is not limited to any particular number of first (or second) channel selections.

In one aspect, the first antenna has a first channel frequency span that is a fractional bandwidth of 0.0025, or greater, with respect to the first frequency band center frequency. Likewise, the second antenna has a second channel frequency span that is a fractional bandwidth of 0.0025, or greater, with respect to the first frequency band center frequency.

Returning to FIG. 1, in a first simple aspect of the system, the resonance and impedance of the first antenna 102 and second antenna 106 are fixed. In this scenario, the channel selectivity is accomplished through the conjugate matched supplied by the first matching circuit 110 and the second matching circuit 112. Alternately stated, first matching circuit 110 has a frequency selectable first conjugate impedance in the first frequency band. Likewise, the second matching circuit 112 has a frequency selectable second conjugate impedance in the first frequency band.

In a second simple scenario, the antenna resonance is fixed, as are the impedances supplied by the matching circuitry. Channel selectivity is provided by controlling the antenna impedance. The antenna impedance is (conjugately) matched to the fixed matching circuit impedance. That is, the first antenna 102 has a selectable first impedance and the second antenna 106 has a selectable second impedance.

In a third simple scenario, the antenna impedance and matching circuit impedances are fixed. The channel selectivity is achieved by controlling the antenna resonant frequency. That is, first antenna 102 resonance is frequency selectable, and the second antenna 106 resonance is frequency selectable.

It should be understood that channel selectivity can be obtained by combining features from the above-mentioned scenarios. For example, channel selectivity can be obtained by adjusting the antenna resonance along with the antenna impedance, or the antenna resonance with the matching circuit impedance, or the antenna impedance with the matching circuit impedance, or the antenna resonance, antenna impedance, and matching circuit impedance simultaneously.

Viewing both FIGS. 1 and 2, in some aspects of the system the first antenna 102 also resonates at a frequency selectable third channel in a second frequency band. The first antenna 102 supplies a corresponding third impedance at the third channel frequency to the first matching circuit interface on line 104. Likewise, the second antenna 106 resonates a frequency selectable fourth channel in the second frequency band. The second antenna 106 supplies a corresponding fourth impedance at the fourth channel frequency to the second matching circuit interface on line 108. The first matching circuit 110 has a third conjugate impedance at the third channel frequency, and the second matching circuit 112 has a fourth conjugate impedance at the fourth channel frequency.

Typically, the system operates in either the first frequency band or the second frequency band, but not in the first and second frequency bands simultaneously. Alternately stated, the first and second antennas 102/106 may resonate simultaneously in the first frequency band. After retuning, the first and second antennas 102/106 may resonate simultaneously in the second frequency band.

This aspect of present invention is useful for a person who owns a cell phone that operates in the cell band at 824 to 894 MHz, for example, when they are home. On travel, the user's network may operate in a different band, for example the GSM 880–960 MHz band. Conventionally, the user has had to own two phones, one for home and one for travel. The present invention permits the user cell phone to efficiently operate in either environment, by selecting the proper frequency band. Alternately stated, the present invention enables a wireless device to efficiently use the same antenna and matching circuitry in two different bands. For example, common circuitry can be for both phone and GPS communications, to support 911 or location-based services.

Figure 6:
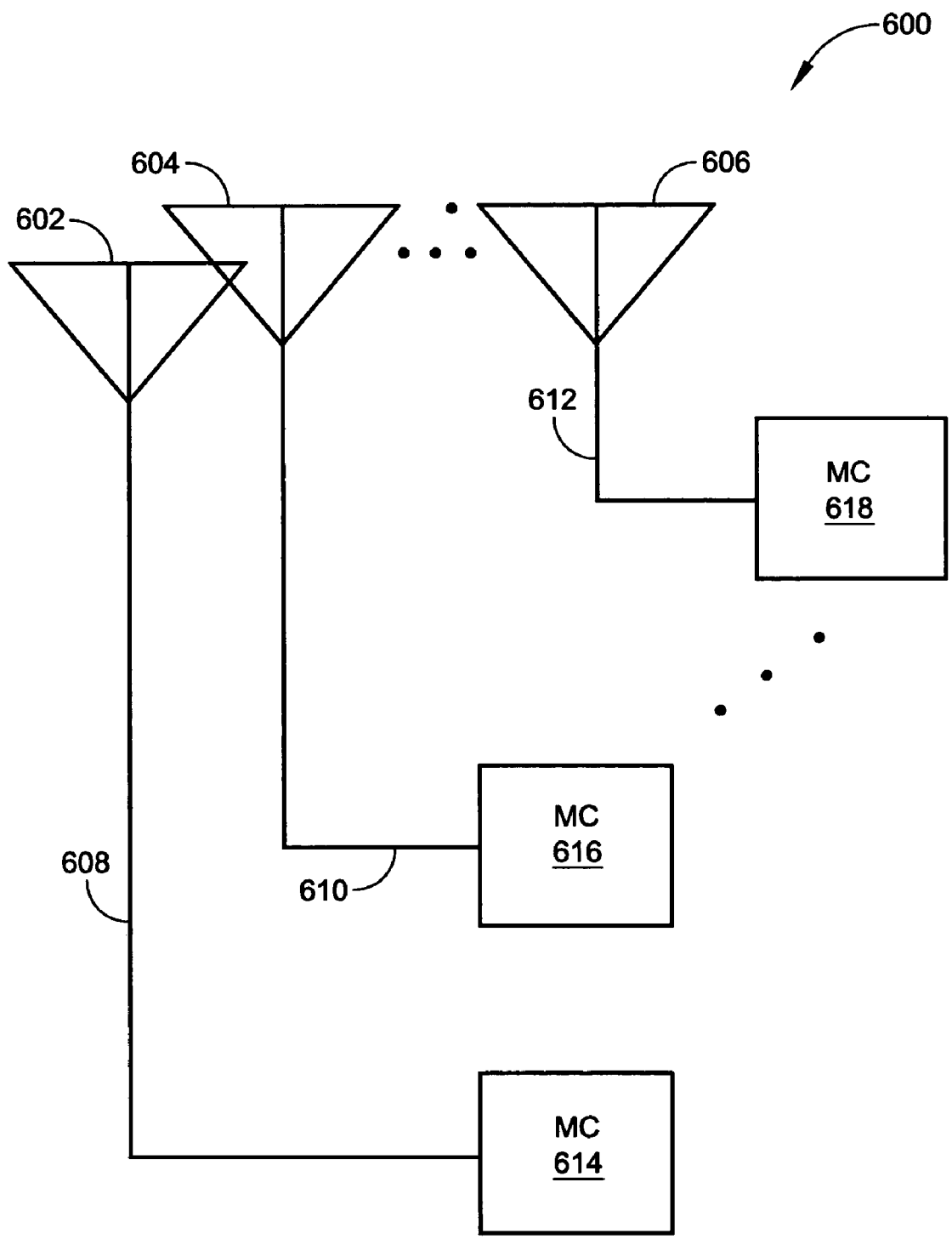
FIG. 6 is a schematic block diagram illustrating another aspect of the system of FIG. 1.

FIG. 6 is a schematic block diagram illustrating another aspect of the system of FIG. 1. Extending the above analysis of FIG. 1 still further, the system 600 comprises a plurality of antennas. Shown are antennas 602, 604, and 606, however, the system is not limited to any particular number of antennas. Each of these antennas 602–606 effectively resonates, as defined in the explanation of FIG. 1, at a frequency selectable channel in a frequency band, for example the first frequency band. Each antenna 602–606 has an interface port with an impedance at the selected channel frequency, on lines 608, 610, and 612, respectively. The system 600 further comprises a corresponding plurality of matching circuits (MCs) 614, 616, and 618. Each matching circuit 614 through 618 has a port connected to a corresponding antenna interface port on lines 608 through 612, respectively, to supply a conjugate impedance at the selected channel frequency. In one aspect, the antennas 602–606 simultaneously effectively resonate at a different channel. For example, the system could support one transmit channel and two receive channels, each at a different frequency. In another aspect, the antennas 602–606 simultaneously effectively resonate at the same channel. For example, the same channel frequency may be received on two different antennas, in the interests of antenna diversity.

To support wireless communications, the first and second antennas 102/106 may resonate at first and second channels, respectively, for a first frequency band in the range between 824 and 894 megahertz (MHz). Alternately, the first frequency band is in the range between 1850 and 1990 MHz, 880 and 960 MHz, 1710 and 1880 MHz, 1900 and 2100 MHz, 410 and 450 MHz, 2400 and 2480 MHz, 4900 and 5900 MHz, or 1565 and 1585 MHz, to name a few examples. The second frequency band may also be described by the above-mentioned list of frequency spans.

Antennas that are capable of resonance and impedance adjustments are described in the above-mentioned Related Applications, and these patent applications are incorporated herein by reference. Antenna matching circuits that are capable of supplying selectable conjugate impedances to an antenna have also been described and these applications are also incorporated herein by reference.

The first and second antennas may one of the following antenna types: inverted-F, monopole, dipole, horn, loop, helix, traveling wave, quadrifilar helix, balanced, unbalanced antennas, electric dipole, magnetic dipole, or capacitively-loaded magnetic dipole antennas. To help clarify the aspects of antenna selective resonance and adjustable impedance, an exemplary inverted-F antenna is described below. However, it should be understood that the present invention system is not limited to any particular antenna style. Neither is it necessary that the first and second antenna be the same type of antenna.

Figure 3:
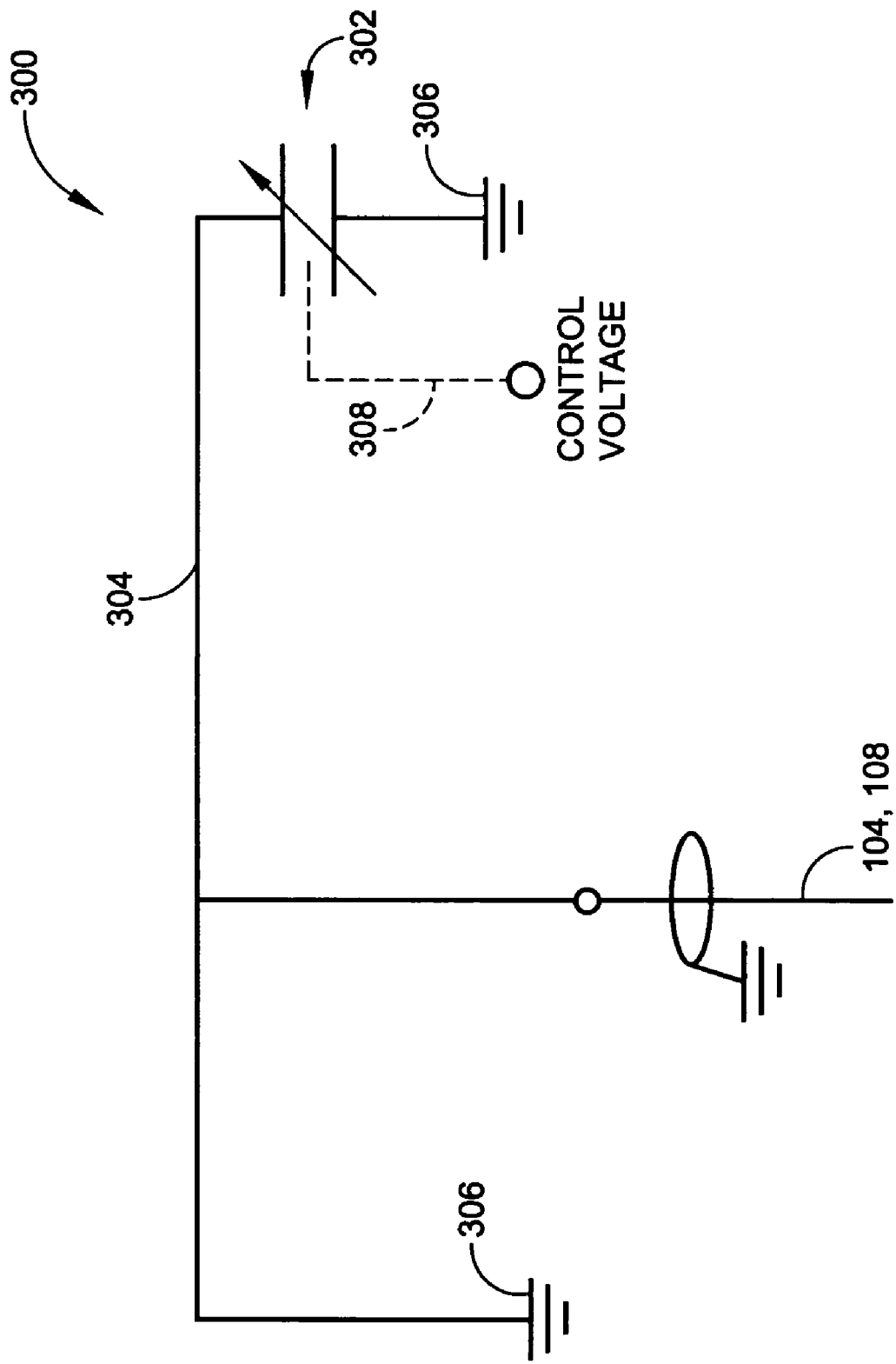
FIG. 3 is a schematic block diagram illustrating a resonant-frequency adjustable inverted-F antenna.

FIG. 3 is a schematic block diagram illustrating a resonant-frequency adjustable inverted-F antenna. In one aspect, the first antenna (and/or second antenna) is an inverted-F antenna 300. The inverted-F antenna 300 includes a first variable capacitor 302, connected in shunt between an antenna radiator 304 and a reference voltage 306. For example, the reference voltage may be ground. The first capacitor 302 is used to vary the frequency of resonance. Alternately stated, the first capacitor 302 is used to vary the effective electrical wavelength of the radiator 304.

In one aspect, the first variable capacitor 302 includes a ferroelectric dielectric with a dielectric constant responsive to a control voltage and an interface on line 308 to accept the control voltage. Ferroelectric (FE) capacitors capable of enabling the above-mentioned variable capacitor function are described in detail, in patent applications listed in the Related Applications Section, above. These FE-related applications are incorporated herein by reference. For example, the ferroelectric variable capacitor 302 may be an interdigital, gap, or overlay capacitors. However, it should be noted that the variable capacitor 302 may be fabricated from conventional components, or a combination of FE and conventional components.

Figure 4:
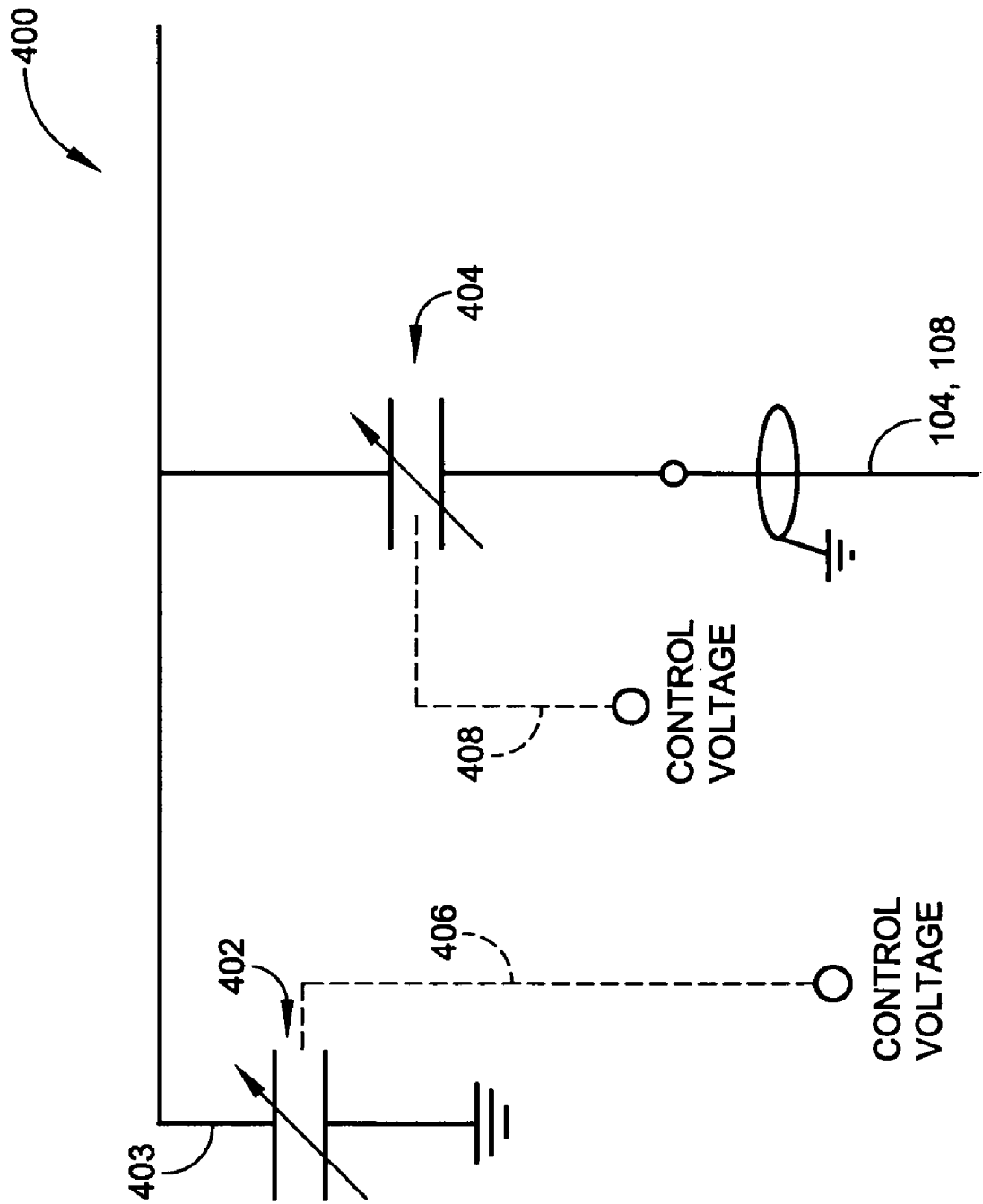
FIG. 4 is a schematic block diagram of an impedance adjustable inverted-F antenna.

FIG. 4 is a schematic block diagram of an impedance adjustable inverted-F antenna. In one aspect, the first antenna is an inverted-F antenna 400 with a second variable capacitor 402, in series in a leg of a grounded resonator section 403, to vary the first impedance. Alternately, a third variable capacitor 404 is shown connected in series with a matching circuit (not shown) to vary the first impedance. In another variation, both the second capacitor 402 and the third capacitor 404 may be used to vary impedance. Likewise, the second antenna could be an inverted-F antenna that provides a varied second impedance in an equivalent manner. As mentioned in the explanation of FIG. 3, the second capacitor 402 and third variable capacitor 404 may include a ferroelectric dielectric with a dielectric constant responsive to a control voltage. Second capacitor 402 has as an interface on line 406 to accept the control voltage, and third capacitor 404 has an interface on line 408 to accept the control voltage. The ferroelectric variable capacitors 402 and 404 may be an interdigital, gap, or overlay capacitors.

In other aspects not shown, the impedance is controlled with a variable capacitor placed in shunt to line 104. Further, the match can be varied using an "L", "T", or π networks, to name a few examples. Further, the matching can be performed with conventional components, or combinations of conventional and FE components. It should also be understood that the inverted-F antenna may include capacitors to vary both the impedance, as well as the resonant frequency (see FIG. 3).

Figure 5:
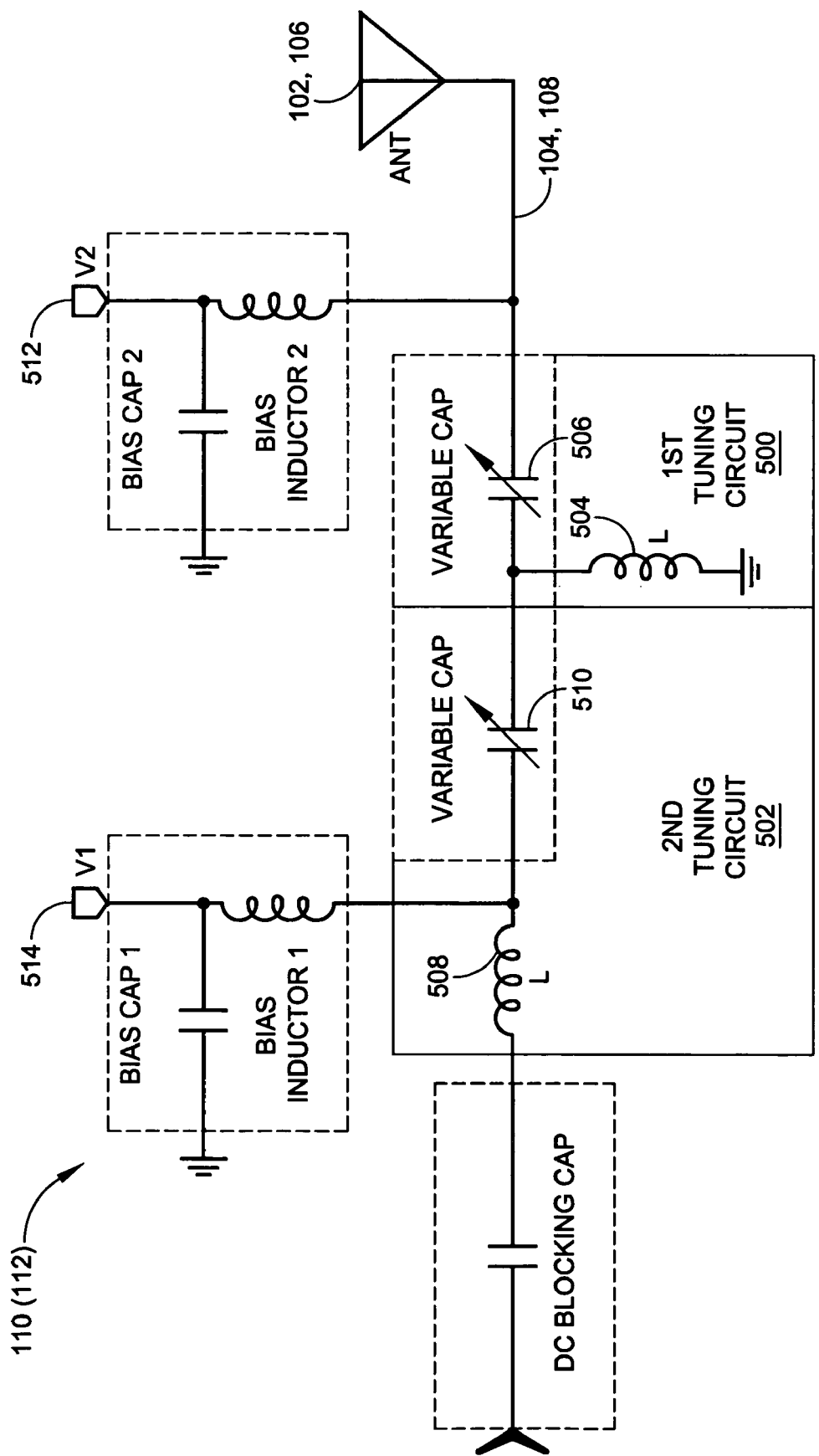
FIG. 5 is a schematic block diagram of an impedance adjustable matching circuit.

FIG. 5 is a schematic block diagram of an impedance adjustable matching circuit. The first matching circuit is used as an example, but the explanation below applies equally well to the second matching circuit. In one aspect, the first matching circuit 110 includes a first tuning circuit 500 and a second tuning circuit 502. Although these circuits are shown as arranged in series, parallel arrangements are also possible.

An exemplary first tuning circuit 500 may include a first inductor 504 with a fixed inductance value and a fifth variable capacitor 506 with a selectable capacitance value. Likewise, the second tuning circuit 502 includes a second inductor 508 with a fixed inductance value and a sixth variable capacitor 510 with a selectable capacitance value.

The fifth capacitor 506 and sixth capacitor 510 may include a ferroelectric dielectric with a dielectric constant responsive to a control voltage, and an interface to accept control voltages on lines 512 and 514, respectively. The first capacitor 506 and sixth capacitor 510 may be interdigital, gap, or overlay capacitors.

Although the first and second tuning circuits 500/502 are shown configured in an "L" topology, those skilled in the art would be able to enable the same functionality using tunable series elements, tunable shunt elements, π, "T", and combinations of the above-mentioned topologies in different aspects of the invention. Also, the tuning circuits can be enabled with a combination of conventional capacitors, voractor diodes, and/or FE capacitors.

Figure 7:
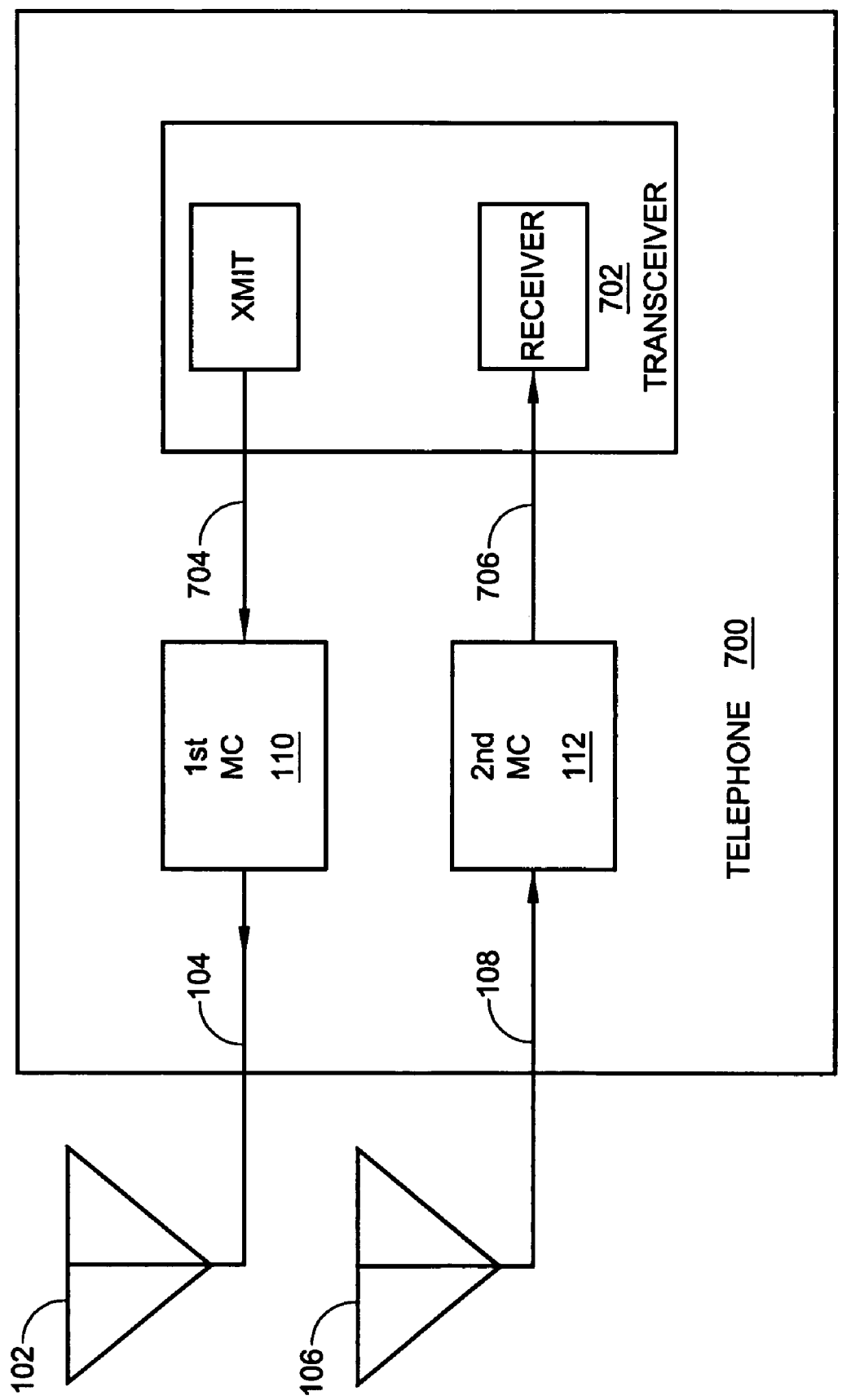
FIG. 7 is a schematic block diagram of the present invention wireless telephone with a full-duplex antenna matching system.

FIG. 7 is a schematic block diagram of the present invention wireless telephone with a full-duplex antenna matching system. The telephone 700 comprises a transceiver 702 having a transmit port on line 704 and a receiver port on line 706 to process antenna communications in a first frequency band. The first antenna 102 is effectively resonant at a frequency selectable first channel in a first frequency band, and has an interface port on line 104 with a first impedance at the first channel frequency. The second antenna 106 is effectively resonant at a frequency selectable second channel in the first frequency band, and has an interface on line 108 with a second impedance responsive at the second channel frequency.

A first matching circuit 110 has an output port connected to the first antenna interface port on line 104 with a first conjugate impedance at the first channel frequency. The first matching circuit 110 has an input port connected to the transceiver transmit port on line 704. A second matching circuit 112 has an input port connected to the second antenna interface port on line 108 with a second conjugate impedance at the second channel frequency. The second matching circuit 112 has an output port connected to the transceiver receive port on line 706.

In one aspect, the first matching circuit 110 has a frequency selectable first conjugate impedance in the first frequency band. Likewise, the second matching circuit 112 has a frequency selectable second conjugate impedance in the first frequency band.

In a second aspect, the first antenna 102 has a selectable first impedance, and the second antenna 106 has a selectable second impedance. In a third aspect, first antenna 102 resonance is frequency selectable, and the second antenna 106 resonance is frequency selectable.

In a different aspect of the telephone 700, the transceiver 702 additionally processes antenna communications in a second frequency band. In this aspect, the first antenna 102 resonates at a frequency selectable third channel in the second frequency band, with a corresponding third impedance at the third channel frequency. Likewise, the second antenna 106 resonates at a frequency selectable fourth channel in the second frequency band, with a corresponding fourth impedance at the fourth channel frequency. The first matching circuit 110 has a third conjugate impedance at the third channel frequency, and the second matching circuit 112 has a fourth conjugate impedance at the fourth channel frequency.

Typically, the telephone 700 is tuned to operate in either the first frequency band or the second frequency band, but not simultaneously in both the first and second frequency bands. However, the telephone 700 may operate so that the first and second antennas 102/106 effectively resonate simultaneously in the first frequency band. When tuned for second frequency band operation, the first and second antennas 102/106 effectively resonate simultaneously in the second frequency band.

Additional details of the first antenna 102, second antenna 106, first matching circuit 110, and second matching circuit 112 are described above in the explanations of FIGS. 1, and 3–6 above, and are not repeated here in the interests of brevity.

Figure 8:
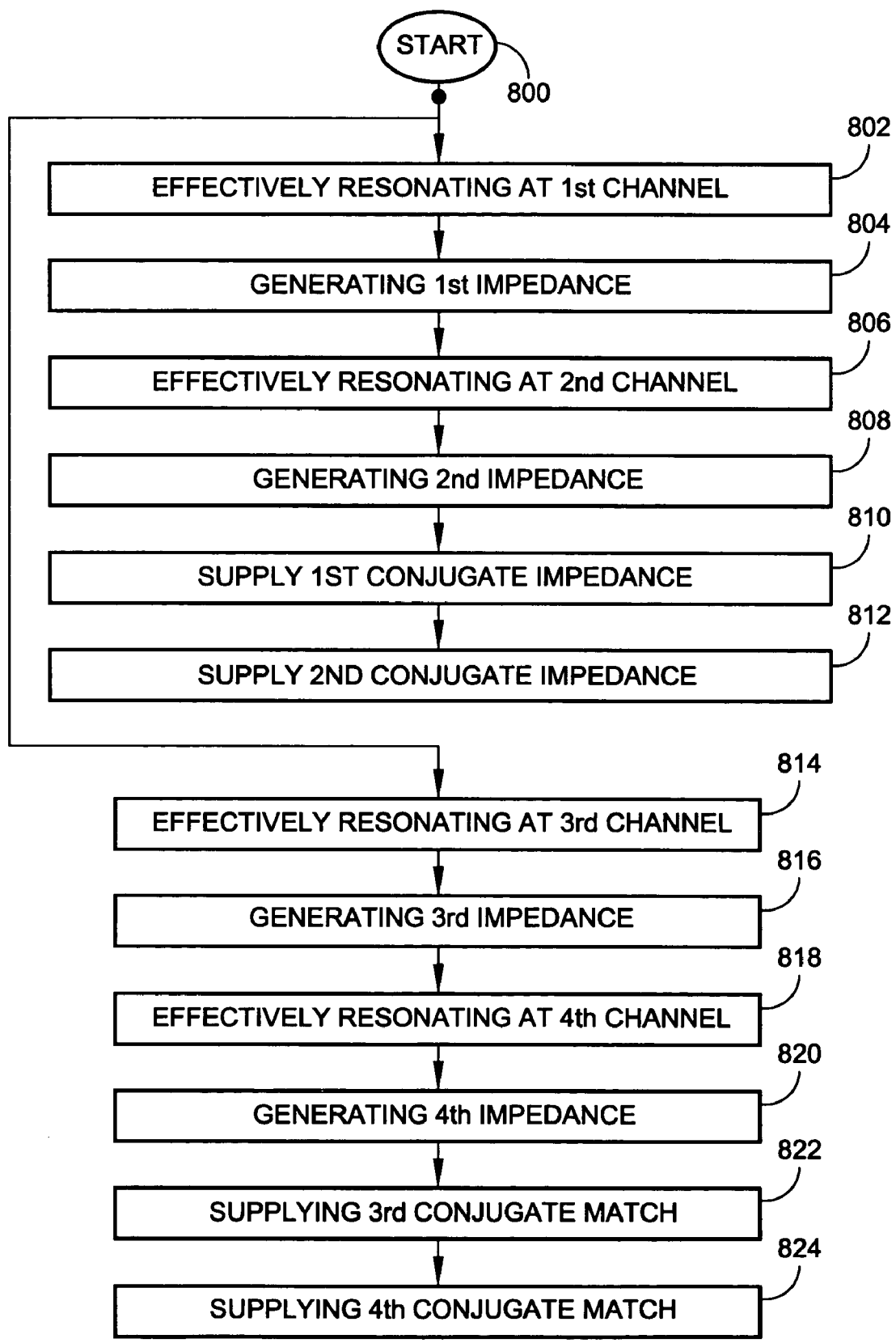
FIG. 8 is a flowchart illustrating the present invention method for full-duplex antenna impedance matching.

FIG. 8 is a flowchart illustrating the present invention method for full-duplex antenna impedance matching. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 800.

Step 802 effectively resonates a first antenna, as defined above, at a frequency selectable first channel in a first frequency band. Step 804 generates a first antenna impedance at the first channel frequency. Step 806 effectively resonates a second antenna at a frequency selectable second channel in the first frequency band. With respect to Steps 804 and 806, in some aspects effectively resonating means resonating with an efficiency of greater than 30% at every channel in the first frequency band. Step 808 generates a second antenna impedance at the second channel frequency. Step 810 supplies a first conjugate impedance match at the first channel frequency. Step 812 supplies a second conjugate impedance match at the second channel frequency.

In one aspect of the method, supplying a first conjugate impedance match at the first channel frequency (Step 810) includes supplying a frequency selectable first conjugate impedance. Likewise, Step 812 supplies a frequency selectable second conjugate impedance.

In another aspect, generating a first antenna impedance at the first channel frequency (Step 804) includes generating a frequency selectable first impedance. Likewise, Step 808 generates a frequency selectable second impedance. In a different aspect, effectively resonating a first antenna at a frequency selectable first channel in a first frequency band (Step 802) includes selecting the frequency of resonance. In this aspect, Step 806 selects the frequency of resonance.

In a different aspect, the method comprises further steps. Step 814 effectively resonates the first antenna at a frequency selectable third channel in a second frequency band. Step 816 generates a third antenna impedance at the third channel frequency. Step 818 effectively resonates the second antenna at a frequency selectable fourth channel in the second frequency band. Step 820 generates a fourth antenna impedance at the fourth channel frequency. Step 822 supplies a third conjugate impedance match at the third channel frequency. Step 824 supplies a fourth conjugate impedance match at the fourth channel frequency.

For example, the first and second antennas may resonate (Steps 802 and 806) simultaneously at the first and second channels, respectively. Alternately the first and second antennas may resonate (Step 814 and 818) simultaneously at the third and fourth channels, respectively. Note, the method need not necessarily perform all four steps, Steps 802, 806, 814, and 818, simultaneously.

In one aspect, the first and second channels resonate (Step 802 and 806) in a first frequency band in the range between 824 and 894 MHz. Other first frequency band ranges include: between 1850 and 1990 MHz, between 880 and 960 MHz, between 1710 and 1880 MHz, between 1900 and 2100 MHz, between 410 and 450 MHz, between 2400 and 2480 MHz, between 4900 and 5900 MHz, and between 1565 and 1585 MHz, to name a few examples. These same ranges apply to the definition of the second frequency range.

In one aspect, effectively resonating a first antenna at a frequency selectable first channel in a first frequency band includes (Step 802) transmitting information via the first channel. Effectively resonating a second antenna at a frequency selectable second channel in a first frequency band (Step 806) includes receiving information via the second channel.

Figure 9:
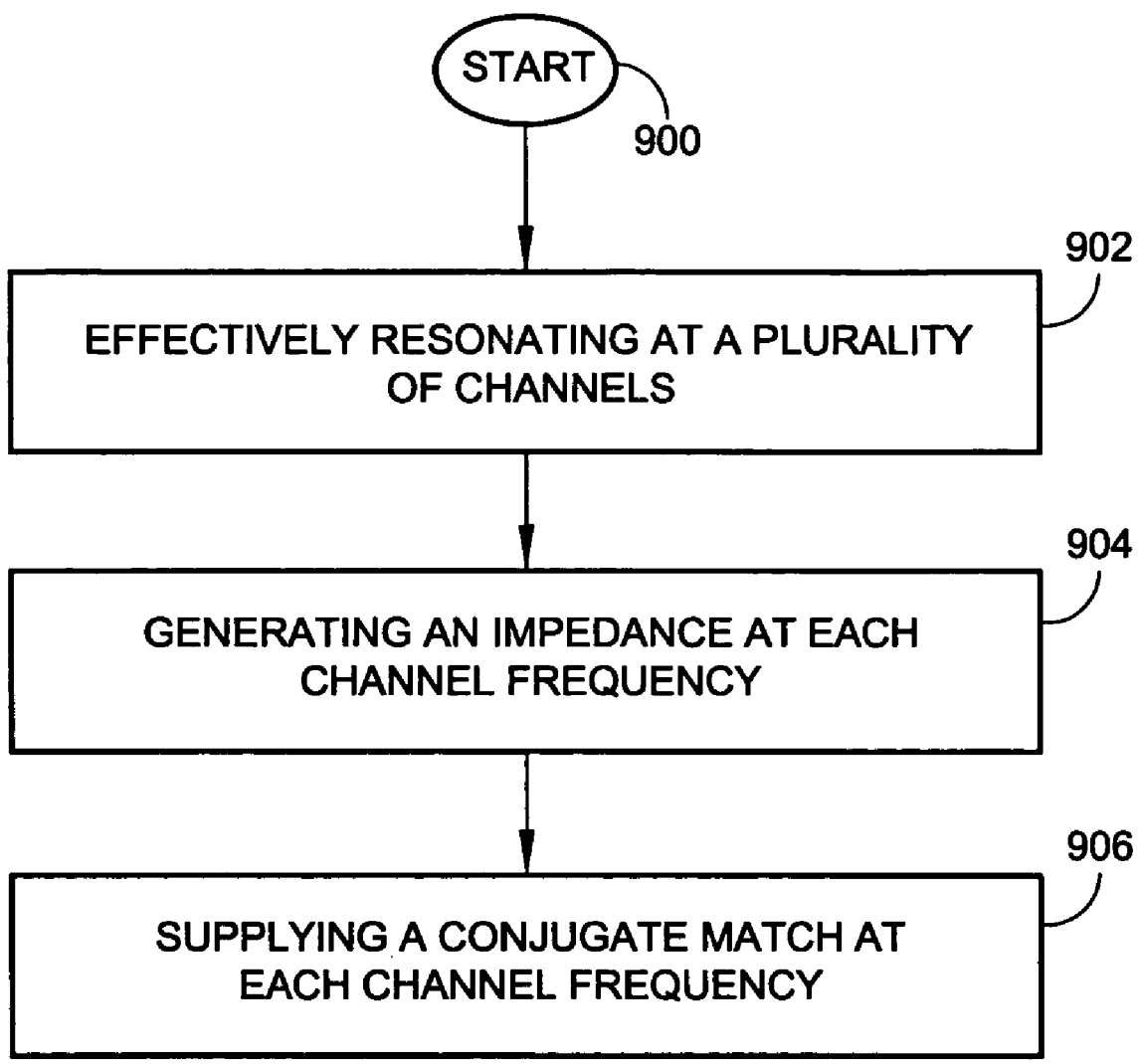
FIG. 9 is a flowchart illustrating an alternate aspect of the method of FIG. 8.

FIG. 9 is a flowchart illustrating an alternate aspect of the method of FIG. 8. The method starts at Step 900. Step 902 effectively resonates a plurality of antennas at a frequency selectable channel in the first frequency band. These channels may, or may not be at the same frequency. Step 904 generates an impedance at each channel frequency. Step 906 supplies a conjugate impedance match at each channel frequency. Alternately, stated, a conjugate match is supplied for each of the antennas.

A channel-selectable full-duplex antenna system and method have been provided. Examples of particular antenna designs, matching circuit designs, and operating frequencies have been described for the purposes of clarification. However, the invention is not limited to merely these examples.

Other variations and embodiments of the invention will occur to those skilled in the art.

We claim:

1. A full-duplex antenna system for selectively tuning communication channels, the system comprising:
   a first antenna effectively resonant at a frequency selectable first channel in an first frequency band, having an interface port with a first impedance at the first channel frequency;
   a second antenna effectively resonant at a frequency selectable second channel in the first frequency band, having an interface with a second impedance at the second channel frequency;
   a first matching circuit including a port connected to the first antenna interface port having a first conjugate impedance at the first channel frequency; and,
   a second matching circuit including a port connected to the second antenna interface port having a second conjugate impedance at the second channel frequency.

2. The system of claim 1 wherein first matching circuit has a frequency selectable first conjugate impedance in the first frequency band; and,
   wherein the second matching circuit has a frequency selectable second conjugate impedance in the first frequency band.

3. The system of claim 2 wherein the first matching circuit includes:
   a first tuning circuit; and,
   a second tuning circuit; and,
   wherein the second matching circuit includes:
   a third tuning circuit; and,
   a fourth tuning circuit.

4. The system of claim 3 wherein the first tuning circuit includes:
   a first inductor with a fixed inductance value;
   a fifth variable capacitor with a selectable capacitance value; and,
   wherein the second tuning circuit includes:
   a second inductor with a fixed inductance value;
   a sixth variable capacitor with a selectable capacitance value.
   wherein the third tuning circuit includes:
   a third inductor with a fixed inductance value;
   a seventh variable capacitor with a selectable capacitance value; and,
   wherein the fourth tuning circuit includes:
   a fourth inductor with a fixed inductance value;
   an eighth variable capacitor with a selectable capacitance value.

5. The system of claim 4 wherein the fifth, sixth, seventh, and eighth variable capacitors include:
   a ferroelectric dielectric with a dielectric constant responsive to a control voltage; and,
   an interface to accept the control voltage.

6. The system of claim 5 wherein the ferroelectric variable capacitors are selected from the group including interdigital, gap, and overlay capacitors.

7. The system of claim 3 wherein the first and second matching circuits are a matching topology selected from the group including a tunable series element, a tunable shunt element, "L", π, "T", and combinations of the above-mentioned topologies.

8. The system of claim 1 wherein first antenna has a selectable first impendance; and,
   wherein the second antenna has a selectable second impendance.

9. The system of claim 8 wherein the first antenna is an inverted-F antenna and further includes a third variable capacitor, connected in series with the matching circuit to vary the first impedance; and,
   wherein the second antenna is an inverted-F antenna and further includes a fourth variable capacitor, connected in series with the second matching circuit to vary the second impedance.

10. The system of claim 9 wherein the third and fourth variable capacitors include:
    a ferroelectric dielectric with a dielectric constant responsive to a control voltage; and,
    an interface to accept the control voltage.

11. The system of claim 10 wherein the ferroelectric variable capacitors are selected from the group including interdigital, gap, and overlay capacitors.

12. The system of claim 8 wherein the first antenna is an inverted-F antenna and further includes a ninth variable capacitor, connected in series in a leg of a grounded resonator section, to vary the first impedance;
    wherein the second antenna is an inverted-F antenna and further includes a tenth variable capacitor, connected in series in a leg of a grounded resonator section, to vary the second impedance.

13. The system of claim 12 wherein the ninth and tenth variable capacitors include:
    a ferroelectric dielectric with a dielectric constant responsive to a control voltage; and,
    an interface to accept the control voltage.

14. The system of claim 1 wherein first antenna resonance is frequency selectable; and,
    wherein the second antenna resonance is frequency selectable.

15. The system of claim 14 wherein the first antenna is an inverted-F antenna and further includes a first variable capacitor, connected in shunt between an antenna radiator and a reference voltage to vary the frequency of resonance; and,
    wherein the second antenna is an inverted-F antenna and further includes a second variable capacitor, connected in shunt between an antenna radiator and the reference voltage to vary the frequency of resonance.

16. The system of claim 15 wherein the first and second variable capacitors include:
    a ferroelectric dielectric with a dielectric constant responsive to a control voltage; and,
    an interface to accept the control voltage.

17. The system of claim 16 wherein the ferroelectric variable capacitors are selected from the group including interdigital, gap, and overlay capacitors.

18. The system of claim 1 wherein the first antenna effectively resonates at a frequency selectable third channel in a second frequency band, with a corresponding third impedance at the third channel frequency supplied at the interface;
    wherein the second antenna effectively resonates a frequency selectable fourth channel in the second frequency band, with a corresponding fourth impedance at the fourth channel frequency supplied at the interface;
    wherein the first matching circuit has a third conjugate impedance at the third channel frequency; and,
    wherein the second matching circuit has a fourth conjugate impedance at the fourth channel frequency.

19. The system of claim 18 wherein the first and second antennas resonate simultaneously in the first frequency band; and, wherein the first and second antennas resonate simultaneously in the second frequency band.

20. The system of claim 1 wherein the first and second antennas resonate at first and second channels, respectively, for a first frequency band in the range between 824 and 894 megahertz (MHz).

21. The system of claim 1 wherein the first and second antennas resonate at first and second channels, respectively, for a first frequency band in the range between 1850 and 1990 MHz.

22. The system of claim 1 wherein the first and second antennas resonate at first and second channels, respectively, for a first frequency band in the range between 880 and 960 MHz.

23. The system of claim 1 wherein the first and second antennas resonate at first and second channels, respectively, for a first frequency band in the range between 1710 and 1880 MHz.

24. The system of claim 1 wherein the first and second antennas resonate at first and second channels, respectively, for a first frequency band in the range between 1900 and 2100 MHz.

25. The system of claim 1 wherein the first and second antennas resonate at first and second channels, respectively, for a first frequency band in the range between 410 and 450 MHz.

26. The system of claim 1 wherein the first and second antennas resonate at first and second channels, respectively, for a first frequency band in the range between 2400 and 2480 MHz.

27. The system of claim 1 wherein the first and second antennas resonate at first and second channels, respectively, for a first frequency band in the range between 4900 and 5900 MHz.

28. The system of claim 1 wherein the first and second antennas resonate at first and second channels, respectively, for a first frequency band in the range between 1565 and 1585 MHz.

29. The system of claim 1 wherein the first antenna effectively resonates with an antenna efficiency of greater than 30%, respective to each channel in the first frequency band; and,
wherein the second antenna effectively resonates with an antenna efficiency of greater than 30%, respective to each channel in the first frequency band.

30. The system of claim 29 wherein the first antenna has a first channel frequency span that is a fractional bandwidth of 0.0025, or greater, with respect to the first frequency band center frequency; and,
wherein the second antenna has a second channel frequency span that is a fractional bandwidth of 0.0025, or greater, with respect to the first frequency band center frequency.

31. The system of claim 1 wherein the first and second antennas are antennas selected from the group including inverted-F, monopole, dipole, horn, loop, helix, traveling wave, quadrifilar helix, balanced, unbalanced antennas, electric dipole, magnetic dipole, and capacitively-loaded magnetic dipole antennas.

32. The system of claim 1 wherein the first antenna receives radiated communications; and,
wherein the second antenna transmits radiated communications.

33. The system of claim 1 further comprising:
a plurality of antennas, each effectively resonant at a frequency selectable channel in a frequency band, and having an interface port with a impedance at the selected channel frequency; and,
a plurality of matching circuits, each having a port connected to a corresponding antenna interface port having a conjugate impedance at the selected channel frequency.

34. The system of claim 33 wherein the plurality of antennas simultaneously effectively resonate at a different channel.

35. The system of claim 33 wherein the plurality of antennas simultaneously effectively resonate at the same channel.

36. A wireless telephone with a full-duplex antenna matching system, the telephone comprising:
a transceiver having a transmit port and a receiver port to process antenna communications in a first frequency band;
a first antenna effectively resonant at a frequency selectable first channel in an first frequency band, having an interface port with a first impedance at the first channel frequency;
a second antenna effectively resonant at a frequency selectable second channel in the first frequency band, having an interface with a second impedance responsive at the second channel frequency;
a first matching circuit having an output port connected to the first antenna interface port with a first conjugate impedance at the first channel frequency, and an input port connected to the transceiver transmit port; and,
a second matching circuit having an input port connected to the second antenna interface port with a second conjugate impedance at the second channel frequency, and an output port connected to the transceiver receive port.

37. The telephone of claim 36 wherein first matching circuit has a frequency selectable first conjugate impedance in the first frequency band; and,
wherein the second matching circuit has a frequency selectable second conjugate impedance in the first frequency band.

38. The telephone of claim 36 wherein first antenna has a selectable first impedance; and,
wherein the second antenna has a selectable second impedance.

39. The telephone of claim 36 wherein first antenna resonance is frequency selectable; and,
wherein the second antenna resonance is frequency selectable.

40. The telephone of claim 36 wherein the transceiver additionally processes antenna communications is a second frequency band;
wherein the first antenna effectively resonates at a frequency selectable third channel in the second frequency band, with a corresponding third impedance at the third channel frequency;
wherein the second antenna effectively resonates at a frequency selectable fourth channel in the second frequency band, with a corresponding fourth impedance at the fourth channel frequency;
wherein the first matching circuit has a third conjugate impedance at the third channel frequency; and,
wherein the second matching circuit has a fourth conjugate impedance at the fourth channel frequency.

41. The telephone of claim 40 wherein the first and second antennas resonate simultaneously in the first frequency band; and, wherein the first and second antennas resonate simultaneously in the second frequency band.

42. A method for full-duplex antenna impedance matching, the method comprising:
effectively resonating a first antenna at a frequency selectable first channel in a first frequency band;
generating a first antenna impedance at the first channel frequency;
effectively resonating a second antenna at a frequency selectable second channel in the first frequency band;
generating a second antenna impedance at the second channel frequency;
supplying a first conjugate impedance match at the first channel frequency; and,
supplying a second conjugate impedance match at the second channel frequency.

43. The method of claim 42 wherein supplying a first conjugate impedance match at the first channel frequency includes supplying a frequency selectable first conjugate impedance; and,
wherein supplying a second conjugate impedance match at the second channel frequency includes supplying a frequency selectable second conjugate impedance.

44. The method of claim 42 wherein generating a first antenna impedance at the first channel frequency includes generating a frequency selectable first impedance; and,
wherein generating a second antenna impedance at the second channel frequency includes generating a frequency selectable second impedance.

45. The method of claim 42 wherein effectively resonating a first antenna at a frequency selectable first channel in a first frequency band includes selecting the frequency of resonance; and,
wherein effectively resonating a second antenna at a frequency selectable second channel in a first frequency band includes selecting the frequency of resonance.

46. The method of claim 42 further comprising:
effectively resonating the first antenna at a frequency selectable third channel in a second frequency band;
generating a third antenna impedance at the third channel frequency;
effectively resonating the second antenna at a frequency selectable fourth channel in the second frequency band;
generating a fourth antenna impedance at the fourth channel frequency;
supplying a third conjugate impedance match at the third channel frequency; and,
supplying a fourth conjugate impedance match at the fourth channel frequency.

47. The method of claim 46 wherein the first and second antennas resonate simultaneously at the first and second channels, respectively; and,
wherein the first and second antennas resonate simultaneously at the third and fourth channels, respectively.

48. The method of claim 42 wherein the first and second channels are resonate in a first frequency band in the range between 824 and 894 megahertz (MHz).

49. The method of claim 42 wherein the first and second channels are resonate in a first frequency band in the range between 1850 and 1990 MHz.

50. The method of claim 42 wherein the first and second channels are resonate in a first frequency band in the range between 880 and 960 MHz.

51. The method of claim 42 wherein the first and second channels are resonate in a first frequency band in the range between 1710 and 1880 MHz.

52. The method of claim 42 wherein the first and second channels are resonate in a first frequency band in the range between 1900 and 2100 MHz.

53. The method of claim 42 wherein the first and second channels are resonate in a first frequency band in the range between 410 and 450 MHz.

54. The method of claim 42 wherein the first and second channels are resonate in a first frequency band in the range between 2400 and 2480 MHz.

55. The method of claim 42 wherein the first and second channels are resonate in a first frequency band in the range between 4900 and 5900 MHz.

56. The method of claim 42 wherein the first and second channels are resonate in a first frequency band in the range between 1565 and 1585 MHz.

57. The method of claim 42 wherein effectively resonating a first antenna at a frequency selectable first channel in a first frequency band includes transmitting information via the first channel; and,
wherein effectively resonating a second antenna at a frequency selectable second channel in a first frequency band includes receiving information via the second channel.

58. The method of claim 42 further comprising:
effectively resonating a plurality of antennas at a frequency selectable channel in the first frequency band;
generating an impedance at each channel frequency; and,
supplying a conjugate impedance match at each channel frequency.

59. The method of claim 42 wherein effectively resonating a first antenna at a frequency selectable first channel in a first frequency band includes resonating with an efficiency of greater than 30% at every channel in the first frequency band; and,
wherein effectively resonating a second antenna at a frequency selectable second channel in a first frequency band includes resonating with an efficiency of greater than 30% at every channel in the first frequency band.

* * * * *